US 7,894,244 B2

(12) United States Patent
Hayakawa et al.

(10) Patent No.: US 7,894,244 B2
(45) Date of Patent: Feb. 22, 2011

(54) TUNNEL MAGNETIC RESISTANCE DEVICE, AND MAGNETIC MEMORY CELL AND MAGNETIC RANDOM ACCESS MEMORY USING THE SAME

(75) Inventors: Jun Hayakawa, Sendai (JP); Hideo Ohno, Sendai (JP); Shoji Ikeda, Sendai (JP); Young Min Lee, Sendai (JP)

(73) Assignees: Hitachi, Ltd., Tokyo (JP); Tohoku University, Miyagi (JP)

( * ) Notice: Subject to any disclaimer, the term of this patent is extended or adjusted under 35 U.S.C. 154(b) by 972 days.

(21) Appl. No.: 11/739,956

(22) Filed: Apr. 25, 2007

(65) Prior Publication Data

US 2007/0253118 A1 Nov. 1, 2007

(30) Foreign Application Priority Data

Apr. 26, 2006 (JP) ............................. 2006-122146

(51) Int. Cl.
*G11C 11/00* (2006.01)
(52) U.S. Cl. ....................................... 365/158; 365/173
(58) Field of Classification Search ................. 365/158, 365/173
See application file for complete search history.

(56) References Cited

U.S. PATENT DOCUMENTS

| 5,695,864 | A | 12/1997 | Slonczewski |
| 6,603,677 | B2 | 8/2003 | Redon et al. |
| 2005/0219767 | A1 | 10/2005 | Nakamura et al. |
| 2006/0128038 | A1* | 6/2006 | Pakala et al. ................. 438/4 |
| 2006/0141640 | A1* | 6/2006 | Huai et al. ................. 438/3 |
| 2006/0227465 | A1 | 10/2006 | Inokuchi et al. |
| 2007/0085068 | A1* | 4/2007 | Apalkov et al. ............. 257/1 |

FOREIGN PATENT DOCUMENTS

| JP | 2002-305337 | 10/2002 |
| JP | 2005-294376 | 10/2005 |
| JP | 2006-269530 | 10/2006 |

OTHER PUBLICATIONS

T. Miyazaki, et al.; Giant magnetic tunneling effect in Fe/Al2O3/Fe junction; Journal of Magnetism and Magnetic Materials 139 (1995); pp. L231-L234.
Shinji Yuasa, et al.; Giant room-temperature magnetoresistance in single-crystal Fe/MgO/Fe magnetic tunnel junctions; Nature Materials; Nature Publishing Group 2004; pp. 1-4.

* cited by examiner

*Primary Examiner*—Michael T Tran
(74) *Attorney, Agent, or Firm*—Antonelli, Terry, Stout & Kraus, LLP.

(57) ABSTRACT

Provided is a high-speed, super-low-power-consumption nonvolatile memory with a high thermal stability. A nonvolatile magnetic memory is equipped with high-output tunnel magnetic resistance devices to each of which a free layer with a high thermal stability is applied, while a writing method by spin transfer torque is applied to the memory. The tunnel magnetic resistance device has a free layer including a first ferromagnetic film and the second ferromagnetic film each of which has a body center cubic structure and each of which contains Co, Fe and B. The free layer, additionally, includes a first non-magnetic layer. The tunnel magnetic resistance device has a layered structure formed of the free layer and a pinned layer with a MgO insulating film with a (100) orientation rock-salt structure interposed in between.

12 Claims, 10 Drawing Sheets

| FIRST FERROMAGNETIC FILM 306 | SECOND FERROMAGNETIC FILM 308 | EXAMPLE OF CHARACTERISTICS (PERTINENT FIGURE) |
|---|---|---|
| [Co(100-x)Fe(x)](100-y)B(y) 0<x<100 (%), 0<y<30 (%) (CoFeB ALLOY: INCLUDING CoB AND FeB) | [Co(100-x)Fe(x)](100-y)B(y) | FIG. 4 |
| | Co(100-x)Fe(x) | FIG. 4 |
| | NiFe | FIG. 5 |
| | [Co(100-x)Fe(x)](100-y)B(y)/Co(100-x)Fe(x) | FIG. 4 |
| | [Co(100-x)Fe(x)](100-y)B(y)/NiFe | FIG. 4 OR FIG. 5 |
| | Co(100-x)Fe(x)/NiFe | FIG. 4 OR FIG. 5 |
| Co(100-x)Fe(x) (Co ALLOY AND Fe ALLOY: INCLUDING Fe AND Co) 0<x<100 (%) | [Co(100-x)Fe(x)](100-y)B(y) | FIG. 4 |
| | Co(100-x)Fe(x) | FIG. 4 |
| | NiFe | FIG. 5 |
| | [Co(100-x)Fe(x)](100-y)B(y)/Co(100-x)Fe(x) | FIG. 4 |
| | [Co(100-x)Fe(x)](100-y)B(y)/NiFe | FIG. 4 OR FIG. 5 |
| | Co(100-x)Fe(x)/NiFe | FIG. 4 OR FIG. 5 |
| NiFe | [Co(100-x)Fe(x)](100-y)B(y)/Co(100-x)Fe(x) | FIG. 6 |
| | [Co(100-x)Fe(x)](100-y)B(y)/NiFe | FIG. 6 OR FIG. 7 |
| | Co(100-x)Fe(x)/NiFe | FIG. 6 OR FIG. 7 |
| | [Co(100-x)Fe(x)](100-y)B(y) | FIG. 6 |
| | Co(100-x)Fe(x) | FIG. 6 |
| | NiFe | FIG. 7 |

FIG. 9

| FIRST FERROMAGNETIC FILM 306 | SECOND FERROMAGNETIC FILM 308 | EXAMPLE OF CHARACTERISTICS (PERTINENT FIGURE) |
|---|---|---|
| [Co(100-x)Fe(x)](100-y)B(y)/Co(100-x)Fe(x) TWO LAYERS OF FERROMAGNETIC LAYER 0<x<100 (%), 0<y<30 (%) | [Co(100-x)Fe(x)](100-y)B(y)/Co(100-x)Fe(x) | FIG. 4 |
| | [Co(100-x)Fe(x)](100-y)B(y)/NiFe | FIG. 4 OR FIG. 5 |
| | Co(100-x)Fe(x)/NiFe | FIG. 4 OR FIG. 5 |
| | [Co(100-x)Fe(x)](100-y)B(y) | FIG. 4 |
| | Co(100-x)Fe(x) | FIG. 4 |
| | NiFe | FIG. 5 |
| [Co(100-x)Fe(x)](100-y)B(y)/NiFe TWO LAYERS OF FERROMAGNETIC LAYER 0<x<100 (%), 0<y<30 (%) | [Co(100-x)Fe(x)](100-y)B(y)/Co(100-x)Fe(x) | FIG. 4 OR FIG. 6 |
| | [Co(100-x)Fe(x)](100-y)B(y)/NiFe | FIG. 4, FIG. 5, FIG. 6 OR FIG. 7 |
| | Co(100-x)Fe(x)/NiFe | FIG. 4, FIG. 5, FIG. 6 OR FIG. 7 |
| | [Co(100-x)Fe(x)](100-y)B(y) | FIG. 4 OR FIG. 6 |
| | Co(100-x)Fe(x) | FIG. 6 |
| | NiFe | FIG. 5 OR FIG. 7 |
| Co(100-x)Fe(x)/NiFe TWO LAYERS OF FERROMAGNETIC LAYER 0<x<100 (%), 0<y<30 (%) | [Co(100-x)Fe(x)](100-y)B(y)/Co(100-x)Fe(x) | FIG. 4 OR FIG. 6 |
| | [Co(100-x)Fe(x)](100-y)B(y)/NiFe | FIG. 4, FIG. 5, FIG. 6 OR FIG. 7 |
| | Co(100-x)Fe(x)/NiFe | FIG. 4, FIG. 5, FIG. 6 OR FIG. 7 |
| | [Co(100-x)Fe(x)](100-y)B(y) | FIG. 4 FIG. 6 |
| | Co(100-x)Fe(x) | FIG. 4 FIG. 6 |
| | NiFe | FIG. 5 FIG. 7 |

TUNNEL MAGNETIC RESISTANCE DEVICE, AND MAGNETIC MEMORY CELL AND MAGNETIC RANDOM ACCESS MEMORY USING THE SAME

CLAIM OF PRIORITY

The present application claims priority from Japanese application JP2006-122146 filed on Apr. 26, 2006, the content of which is hereby incorporated by reference into this application.

BACKGROUND OF THE INVENTION

1. Field of the Invention

The present invention relates to a high-output tunnel magnetic resistance device with a high thermal stability, and to a low-power-consumption nonvolatile magnetic memory using the same.

2. Description of the Related Art

A tunnel magnetic resistance device using magnesium oxide as an insulating film disclosed in S. Yuasa. et al., Nature Material 3, 868 (2004), is a tunnel magnetic resistance device that is applied to a highly-integrated magnetic memory in the future, because, with the disclosed device, a magnetoresistance ratio that is several times larger than that with a tunnel magnetic resistance device using Al oxide as an insulator described in T. Miyazaki and N. Tezuka, J. Magn. Magn. Mater. 139, L231 (1995) is obtained. A conventional nonvolatile magnetic memory is made up of memory cells in each of which a tunnel magnetic resistance device is formed on a MOSFET. MOSFETs are used for switching operations to energize the bit lines and the word lines. Storing data is accomplished by rotating the magnetization direction in the tunnel magnetic resistance device by using a current-induced spatial magnetic field generated by the energization. Recalling data is accomplished using the output voltage of the tunnel magnetic resistance device. Beside the method in which the above-mentioned magnetization rotation using the current-induced spatial magnetic-field, a spin transfer torque magnetization reversal method, known as a method to achieve the above-mentioned purpose, is disclosed, for example, in the specification of U.S. Pat. No. 5,695,864, or in Japanese Patent Application Laid-open No. 2002-305337. Such a method is also known as a spin injection magnetization reversal method, in which magnetization rotation is accomplished by passing a current directly through the magnetic resistance element. To a tunnel magnetic resistance device disclosed in Japanese Patent Application Laid-open No. 2005-294376, a free layer in which a plurality of ferromagnetic films are stacked with a non-magnetic film interposed in between is applied for the purpose of achieving a stable spin transfer torque magnetization reversal operation against the penetration of an external magnetic field.

SUMMARY OF THE INVENTION

What is necessary for accomplishing a low-power-consumption nonvolatile magnetic memory with a high reliability is a technology of a high-output tunnel magnetic resistance device, which technology satisfies a high thermal stability in a free layer (recording layer) together with a writing method that uses spin transfer torque magnetization reversal.

An object of the present invention is to provide a tunnel magnetic resistance device with a high thermal stability, capable of responding to the demand mentioned above.

Another object of the present invention is to provide a nonvolatile magnetic memory using such a tunnel magnetic resistance device.

In the present invention, a compound ferromagnetic film with a body center cubic lattice structure of Co or Fe, containing B is applied to a ferromagnetic film in a tunnel magnetic resistance device. Magnesium oxide with a (100) orientation rock-salt structure is applied to an insulating film. Two ferromagnetic films that are antiferromagnetically coupled with a non-magnetic layer interposed in between are applied to a ferromagnetic free layer. In other words, the tunnel magnetic resistance device according to the present invention includes an insulating film. Also included are a ferromagnetic free layer and a ferromagnetic pinned layer, which are provided with the insulating film interposed in between. The insulating film is a MgO film with a (100) orientation rock-salt structure. The ferromagnetic free layer is made up of a first ferromagnetic film and a second ferromagnetic film, which are provided with a non-magnetic conductive layer interposed in between. The first ferromagnetic film is adjacent to the insulating film. The magnetization of the second ferromagnetic film and the magnetization of the first ferromagnetic film are anti-ferromagnetically coupled with each other. The ferromagnetic film pinned layer includes a film with a body center cubic structure film containing Co, Fe and B.

An insulating film not employing a MgO film with a (100) orientation rock-salt structure renders the magnetoresistance ratio drastically reduced. As a result, the 200-mV read voltage, which is minimum necessary for a magnetic memory cell, or for a magnetic random access memory, cannot be obtained.

The tunnel magnetic resistance device of the present invention is applicable to a magnetic memory cell and to a magnetic random access memory.

The tunnel magnetic resistance device obtained according to an aspect of the present invention has a high thermal stability. A magnetic memory with such a tunnel magnetic resistance device becomes a nonvolatile memory with a high thermal stability, that is, with a long magnetic data retention time.

DESCRIPTION OF THE PREFERRED EMBODIMENT

Hereinbelow, embodiments of the present invention will be described with reference to the drawings. In a tunnel magnetic resistance device to be described below, the magnetization reversal (switching) of its ferromagnetic free layer is accomplished not by a spatial, external magnetic field, but mainly by the torque acting on the magnetic moment of the ferromagnetic free layer with the spin of a spin-polarized current passing through the tunnel magnetic resistance device. This spin-polarized current is generated by the very fact of passing a current through the tunnel magnetic resistance device. Accordingly, a spin transfer torque magnetization reversal is achieved by passing a current, from outside, through the tunnel magnetic resistance device. In the following descriptions, the threshold value of the current density at which a spin transfer torque magnetization reversal takes place is defined as Jc.

EXAMPLE 1

Figure 1:
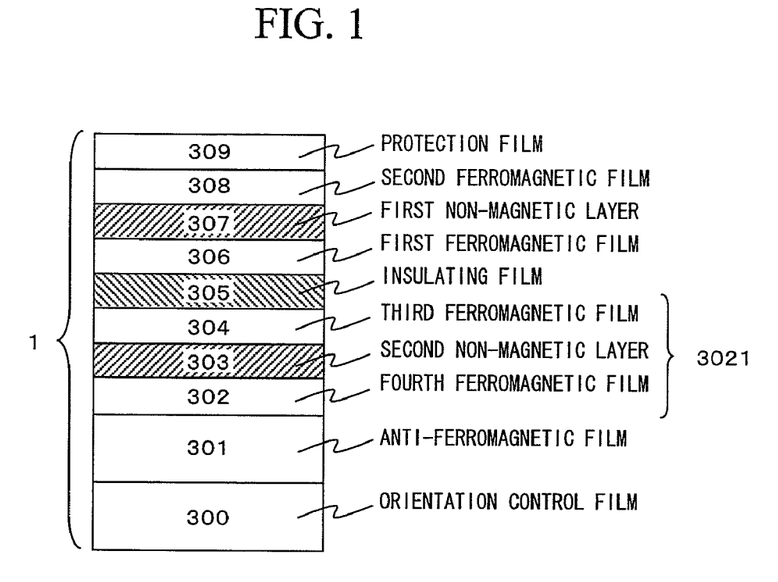
FIG. 1 is a view showing a first configuration example of a tunnel magnetic resistance device of the present invention.

FIG. 1 is a schematic cross-sectional view of an example of a tunnel magnetic resistance device according to an aspect of the present invention. In this example, the tunnel magnetic resistance device was fabricated by a sputtering method. This tunnel magnetic resistance device 1 was made up of an orientation control film 300, an anti-ferromagnetic film 301, a ferromagnetic pinned layer 3021, an insulating film 305, a first ferromagnetic film 306, a first non-magnetic layer 307, a second ferromagnetic film 308, and a protection film 309. In the tunnel magnetic resistance device 1, the optimum magnetoresistance ratio was accomplished by a heat treatment under an appropriate temperature. A heat treatment at a temperature up to 400° C. can be carried out. The ferromagnetic pinned layer 3021 may, in some cases, include a fourth ferromagnetic film 302, a second non-magnetic layer 303, a third ferromagnetic film 304. In the descriptions that follow, the ferromagnetic pinned layer 3021 was made up of the fourth ferromagnetic film 302, the second non-magnetic layer 303 and the third ferromagnetic film 304.

The orientation control film 300 was formed of NiFe (5 nm), but other materials, such as a two-layered film of Ta (5 nm)/NiFe (5 nm), may be used as long as the materials can accomplish an improvement in the orientation of the anti-ferromagnetic film 301, and a stable anti-ferromagnetic coupling. MnIr (8 nm) was used for the anti-ferromagnetic film 301, but the film thickness can be selected from a range between 5 nm to 15 nm. Likewise, a stable anti-ferromagnetic coupling can be accomplished using an anti-ferromagnetic film made up of a Mn compound, such as MnPt, MnFe, or the like. CoFe (2 nm) was used for the fourth ferromagnetic film 302, Ru (0.8 nm) was used for a second non-magnetic layer 303, and CoFeB (3 nm) with a body center cubic lattice structure was used for a third ferromagnetic film 304. Co constituted 50 atm % to 90 atm % of CoFe in the fourth ferromagnetic film 302. Within this range of composition, a stable anti-ferromagnetic coupling was accomplished between the fourth ferromagnetic film 302 and the above-mentioned anti-ferromagnetic film. Materials for the fourth ferromagnetic film 302, the second non-magnetic layer 303 and the third ferromagnetic film 304 were selected so that the magnetization of the fourth ferromagnetic film 302 and the magnetization of the third ferromagnetic film 304 would be anti-ferromagnetically coupled with each other. Meanwhile, the film thicknesses of the films were selected so that the magnetization of the fourth ferromagnetic film 302 and the magnetization of the third ferromagnetic film 304 would have the same magnitude.

Figure 12:
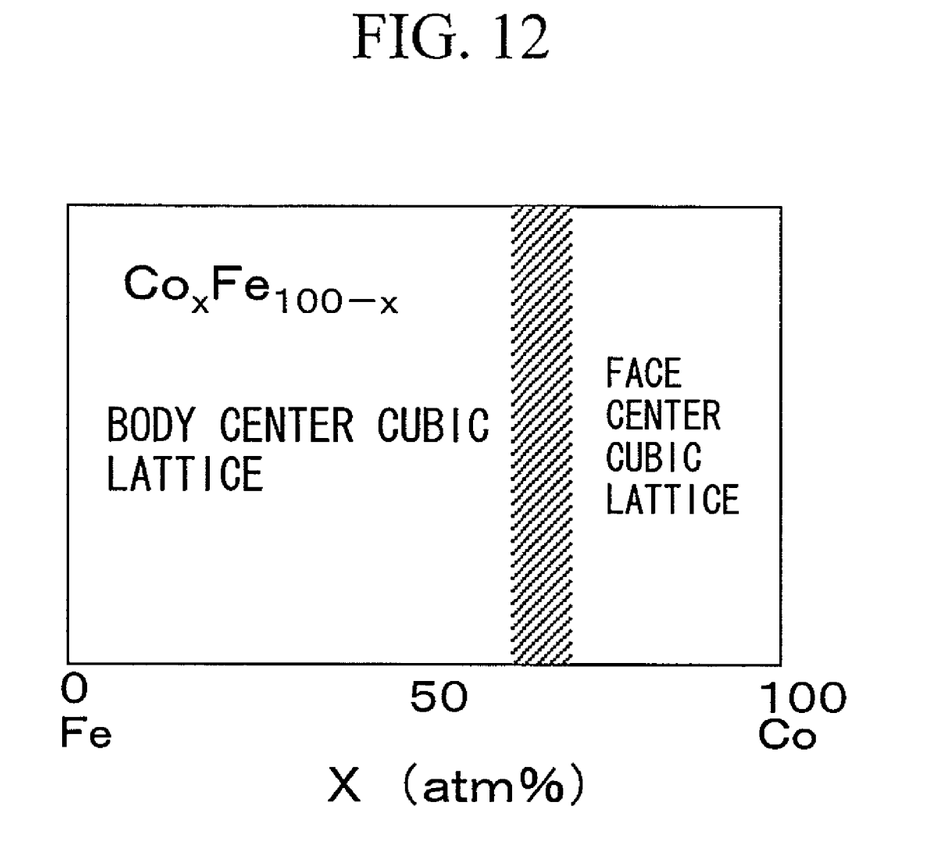
FIG. 12 shows the crystal structure that changes in accordance with the composition of $Co_xFe_{100-x}$.

The insulating film 305, was a film of magnesium oxide crystal with a rock-salt structure, which was (100) oriented. The film thickness of the insulating film was set in a range between 0.8 nm and 3 nm. Use of the insulating film 305 with a film thickness of the above-mentioned range enabled the selection of any electric resistance. CoFeB (3 nm) with a body center cubic lattice structure was used for the second ferromagnetic film 308 as well as for the first ferromagnetic film 306. The CoFeB in each of the first ferromagnetic film 306 and the second ferromagnetic film 308, preferably has the content of Co to the content of Fe in a range between 50:50 to 70:30. The reason is, firstly, within this composition range, as FIG. 12 shows, a stable body center cubic structure existed. Secondly, in the tunnel magnetic resistance device 1 with the insulating film 305 to which MgO was applied, with more content of Fe than that of Co, an improved spin polarization ratio that would contribute to the tunnel magnetoresistance ratio could be obtained. Ru was used for the first non-magnetic layer 307, and its film thickness was selected so that the magnetization of the first ferromagnetic film 306 and the magnetization of the second ferromagnetic film 308 would be coupled antiparallel to each other.

Figure 3A:
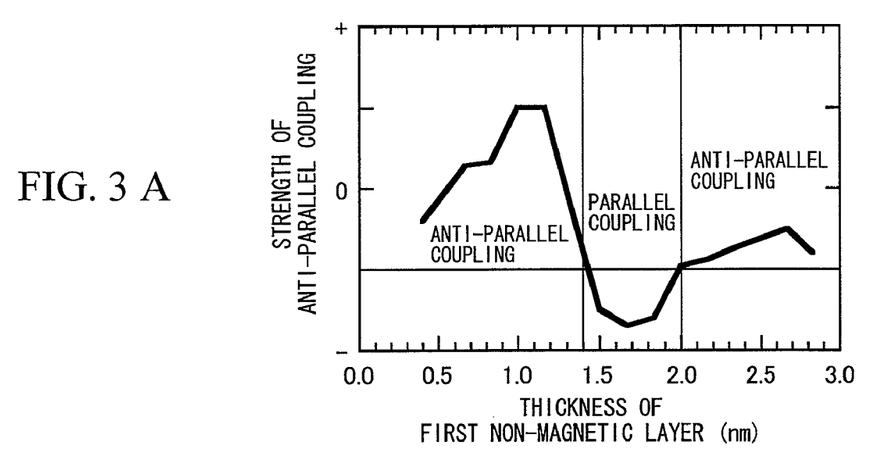
FIG. 3A is a graph in which the strength of the anti-parallel coupling between a first ferromagnetic film and a second ferromagnetic film against the film thickness of a first non-magnetic layer in the tunnel magnetic resistance device of the present invention is plotted.
Figure 3B:
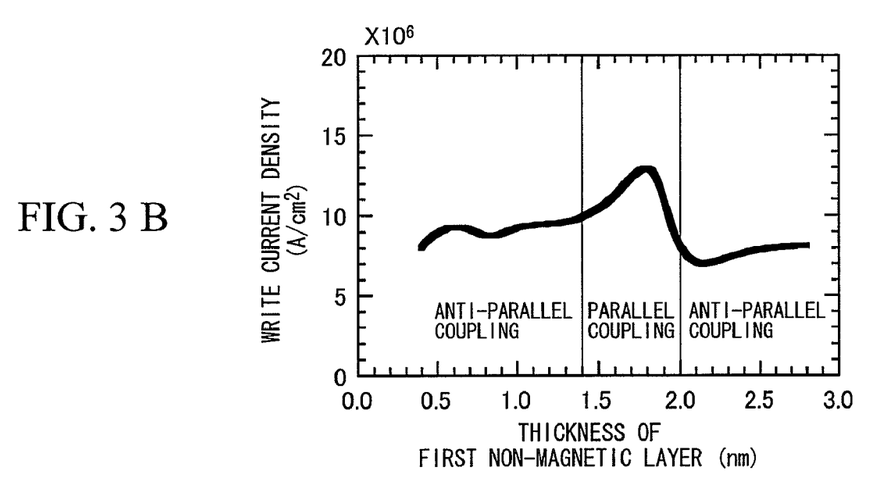
FIG. 3B is a graph in which the write current density against the film thickness of the first non-magnetic layer in the tunnel magnetic resistance device of the present invention is plotted.

FIG. 3A shows, the strength of the magnetization coupling between the first ferromagnetic film 306 and the second ferromagnetic film 308 against the film thickness of the first non-magnetic layer 307. The graph shows that, in the region where the magnetization coupling was positive, the first ferromagnetic film 306 and the second ferromagnetic film 308 were coupled antiparallel to each other. Meanwhile, in the region where the magnetization coupling was negative, the first ferromagnetic film 306 and the second ferromagnetic film 308 were coupled parallel to each other. In FIG. 3B, the magnitude of the write current against the film thickness of the first non-magnetic layer 307 is plotted. FIG. 3B shows that, in the film thickness region shown as the anti-parallel coupling region in FIG. 3A, the write current was small. Accordingly, the film thickness of the first non-magnetic layer 307 is preferably selected from a range between 0.4 nm and 1.4 nm, or a range between 2.0 nm and 2.8 nm.

CoFeB in the third ferromagnetic film 304, the second ferromagnetic film 308 and the first ferromagnetic film 306 may be amorphous, or may be crystallized by a heat treatment at an appropriate temperature. As to the composition ratio of CoFeB, Co content is preferably between 40 atm % and 60 atm % while B content is preferably between 10 atm % to 30 atm % to obtain a stable body center cubic lattice. Furthermore, a CoFe single layer film, or a NiFe single layer film may be used for the first ferromagnetic film 306 and for the second ferromagnetic film 308 in place of the CoFeB single layer film. A CoFe/NiFe two layer film, a CoFeB/NiFe two layer film, or a CoFeB/CoFe two layer film may be used for the same purpose. The Co content in the above-mentioned CoFe single layer film is preferably 50 atm % at which a stable body center cubic lattice structure can be obtained, but the content may vary in a range from 50% to 90%. With a larger Co content, the body center cubic lattice structure becomes stable. Accordingly, although the tunnel magnetoresistance ratio is reduced, a favorable magnetic characteristic such as a small coercive force for a ferromagnetic free layer is achieved. In addition, the threshold current density for spin transfer torque magnetization reversal can be varied in response to the magnitude of the magnetic moment. The protection film 300 was formed as a two layer film of Ta (5 nm)/Ru (5 nm).

Next, descriptions will be given as to the device fabrication process. A photolithography method and an ion milling method were employed in the device fabrication, and a tunnel magnetic resistance device having a minimum area of 0.1 µm×0.12 µm was fabricated. The tunnel magnetoresistance ratio of the tunnel magnetic resistance device thus fabricated can be increased by a heat treatment. With a configuration in which CoFeB is used for the second ferromagnetic film 308 and for the first ferromagnetic film 306, a heat treatment at 375° C. or higher for approximately an hour made the ratio to reach 250%. In addition, when the film thickness of the insulating film 305 was in a range between 0.8 nm and 3.0 nm, a tunnel magnetoresistance ratio of 100% or higher was shown. Moreover, even when the temperature at which the heat treatment is carried out at a temperature of up to 400° C., a favorable magnetoresistance ratio of 150% or higher can be obtained. In particular, it was observed that CoFeB was crystallized by the heat treatment. When the CoFeB after crystallization had a crystal structure of the body center cubic lattice, the tunnel magnetoresistance ratio reached its maximum value.

The (100) orientation magnesium oxide film can be fabricated on the amorphous third ferromagnetic film by a sputtering method. When a (100) orientation magnesium oxide film, however, is fabricated on a third ferromagnetic film with a polycrystalline structure by a sputtering method, a favorable (100) orientation film is hard to be obtained. The tunnel magnetoresistance ratio was no higher than 50%. This shows the following fact. Suppose that the tunnel magnetic resistance device 1 has the first ferromagnetic film 306 and the third ferromagnetic film 304, both of which are made of a crystalline CoFeB, and also has the insulating film 305 made of magnesium oxide of a (100) orientation crystal. When such a device 1 has a tunnel magnetoresistance ratio of 200% or higher, the first ferromagnetic film 306 and the third ferromagnetic film 304 are necessarily made of amorphous CoFeB at the time when the films are formed. The crystalline CoFeB films are fabricated from the amorphous CoFeB through the heat treatment process. Although a high magnetoresistance ratio can be obtained by such crystallization of an amorphous CoFeB film through a heat treatment, the amorphous CoFeB film which is subjected to a heat treatment under a temperature of 350° C. or lower, and which remains in the amorphous state, may be used as it is.

In the above-described method of fabricating the tunnel magnetic resistance device 1, the first ferromagnetic film 306 and the third ferromagnetic film 304 that are amorphous when the films are formed are subjected to a heat treatment to be crystallized. Such a method is different from the conventional ones. Nonetheless, when the tunnel magnetic resistance device 1 has the first ferromagnetic film 306 made of a CoFe single layer film, a NiFe single layer film, or a CoFe/NiFe film, the first ferromagnetic film 306 is already crystalline when the film is formed, and only the third ferromagnetic film 304 is crystallized through the heat treatment. The tunnel magnetic resistance device 1 that had the first ferromagnetic film 306 made of a CoFe single layer film, a NiFe single layer film or a CoFe/NiFe film had a maximum tunnel magnetoresistance ratio of 200%, 40% or 150%, respectively.

Next, descriptions will be given as to the selection of the film thickness to of the first ferromagnetic film 306 and the film thickness t2 of the second ferromagnetic film 308. Here, the selection was made on the premise that t1<t2. This is because when t1>t2, the write current Ic for the spin torque magnetization reversal is strikingly increased.

Figure 4:
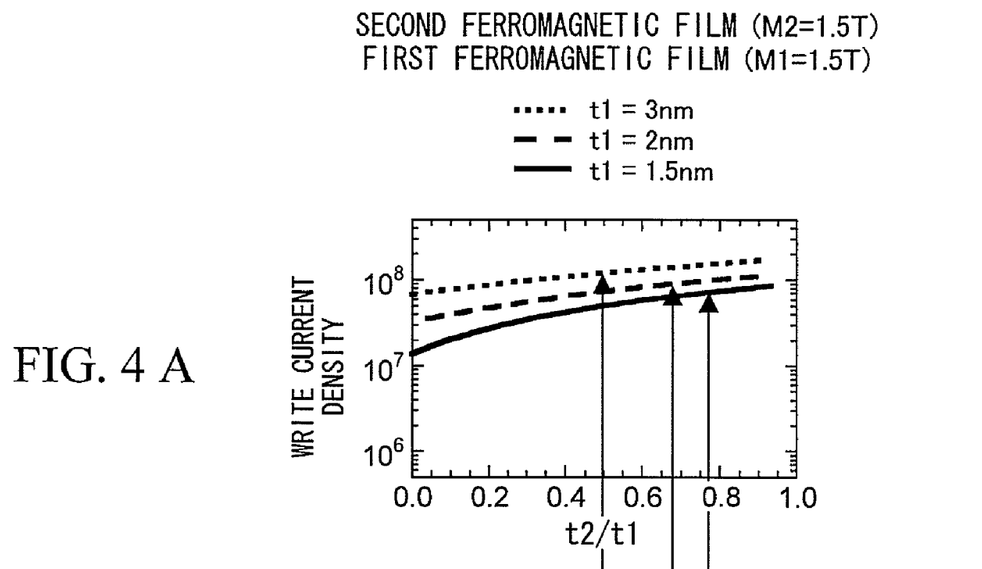
FIG. 4A is a graph showing a characteristic example of the write current in the tunnel magnetic resistance device of the present invention.
FIG. 4B is a graph showing a characteristic example of the thermal stability in the tunnel magnetic resistance device of the present invention.

Firstly, descriptions will be given as to a case where the magnitude (M1) of the first ferromagnetic film 306 is equal to the magnitude (M2) of the second ferromagnetic film 308, that is, M1=M2. FIG. 4 shows an example in which M1=M2=1.5T. This magnitude of magnetization corresponds to the value of CoFeB, or the value of CoFe. FIG. 4A shows the relationship between the threshold current density Jc for spin torque magnetization reversal and the ratio of the film thickness t2 of the second ferromagnetic film 308 to the film thickness t1 of the first ferromagnetic film 306, that is, t2/t1. FIG. 4B shows the relationship between the ratio of film thickness (t2/t1) and the parameter KV/kT, which shows the magnitude of thermal stability. Note that K, V, k and T are physical parameters, and are the uniaxial anisotropy constant, the volume, the Boltzmann constant and the temperature, respectively. The film thicknesses t1 of the first ferromagnetic film 306 were set at 1.5 nm, 2.0 nm and 3.0 nm, respectively.

FIG. 4A shows that, as the film thickness t2 of the second ferromagnetic film 308 became larger, Jc increased, and that, as t1 became smaller, Jc decreased. Meanwhile, FIG. 4B shows that the thermal stability increased as both t1 and t2 became larger. Here, in general, a thermal stability such that the value of KV/kT is equal to 60 or larger is required for a magnetic memory. Such a value is a condition for the retention of data for ten years, which is a necessary and sufficient specification in the current market for memories. Suppose that the film thickness t1 is within a range between 1.5 m and 3.0 nm. To satisfy the above-mentioned value of KV/kT, for example, when t1=3.0 nm, t2 had to be selected as t2/t1>0.5; when t1=2.0 nM, t2 had to be selected as t2/t1>0.65; and when t1=1.5 nm, t2 had to be selected as t2/t1>0.75.

Figure 5:
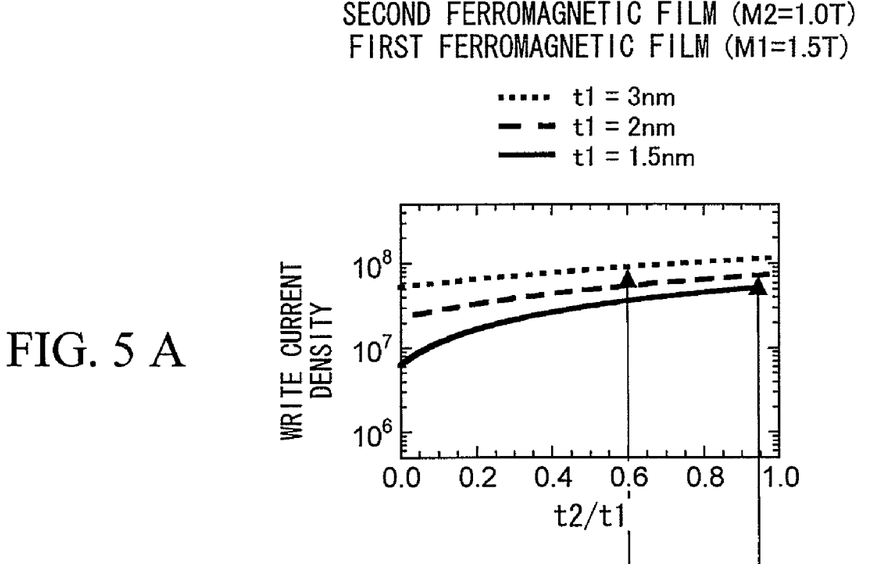
FIG. 5A is a graph showing another characteristic example of the write current in the tunnel magnetic resistance device of the present invention.
FIG. 5B is a graph showing another characteristic example of the thermal stability in the tunnel magnetic resistance device of the present invention.

Next, an evaluation was made as to the case where the magnitude of magnetization of the first ferromagnetic film 306 (M1) is smaller than the magnitude of the magnetization of the second ferromagnetic film 308 (M2), that is, M1<M2. Here, M1 and M2 were set as: M1=1.5T, and M2=1T. The value M=1T corresponds to a case of a NiFe film. FIGS. 5A and 5B show the result. In FIG. 5A, as in FIG. 4A, the threshold current density Jc for spin torque magnetization reversal is plotted, for each film thickness t1, against the ratio of film thickness t2 of the second ferromagnetic film to the film thickness t1 of the first ferromagnetic film. In FIG. 5B, as in FIG. 4B, the parameter KV/kT showing the magnitude of thermal stability is plotted in the same way.

FIGS. 5A and 5B show that, also in the case where M1<M2, the same trend as the one shown in FIG. 4 was observed. Specifically, FIG. 5A shows that, as t2 became larger, Jc increased, and that, as t1 became smaller, Jc decreased. Here, the absolute value of Jc was reduced from the corresponding value in the case where M1=M2. On the other hand, FIG. 5B shows that the thermal stability increased as both t1 and t2 became larger. Now, as in the case described above, suppose that a thermal stability needed for a magnetic memory is such that KV/kT is 60 or larger, and that the film thickness t1 is within a range between 1.5 nm and 3.0 nm. To satisfy the above-mentioned value of KV/kT, for example, when t1=3.0 nm, t2 had to be selected as t2/t1>0.6; when t1=2.0 nm, t2 had to be selected as t2/t1>0.9; and when t1=1.5 nm, it was difficult to achieve KV/kT>60.

Figure 6A:
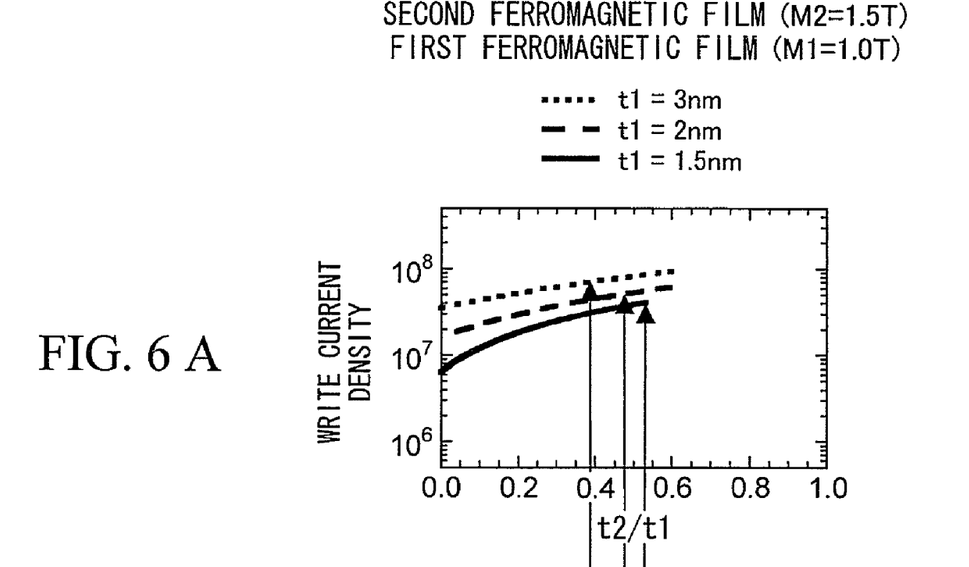
FIG. 6A is a graph showing still another characteristic example of the write current in the tunnel magnetic resistance device of the present invention.
Figure 6B:
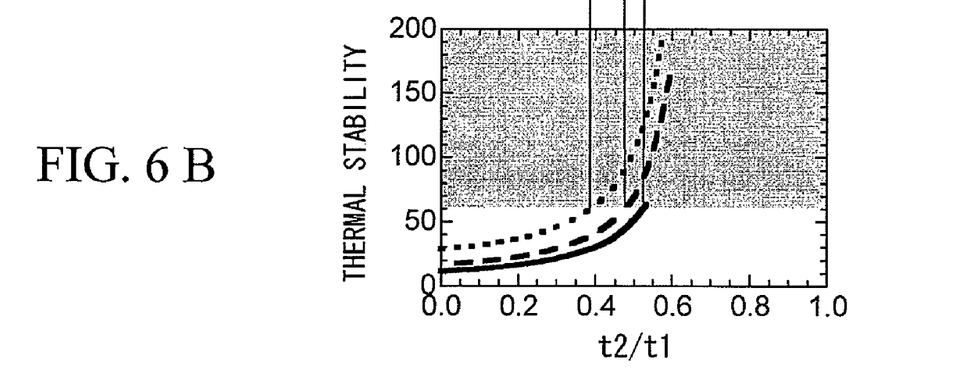
FIG. 6B is a graph showing still another characteristic example of the thermal stability in the tunnel magnetic resistance device of the present invention.

Next, FIGS. 6A and 6B show the results in the case where M1<M2, specifically, M1=1T and M2=1.5T in the following descriptions. In FIG. 6A, as in FIGS. 4A and 5A, Jc is plotted, for each film thickness t1, against the ratio of film thickness t2 of the second ferromagnetic film to the film thickness t1 of the first ferromagnetic film. In FIG. 6B, as in FIGS. 4B and 5B, the parameter KV/kT showing the magnitude of thermal stability is plotted in the same way.

These results show that the same trend as the one shown in FIGS. 4A, 4B, 5A and 5B wad observed. Specifically, FIG. 6A shows that, as t2 became larger, Jc increased, and that, as t1 became smaller, Jc decreased. Here, the absolute value of Jc was reduced from the corresponding values in the cases shown in FIGS. 4A and 4B as well as in FIGS. 5A and 5B, especially when t2/t1<0.5. On the other hand, FIG. 6B shows that the thermal stability increased as both t1 and t2 became larger. Now, as in the case described above, suppose that a thermal stability needed for a magnetic memory is such that KV/kT is 60 or larger, and that the film thickness t1 is within a range between 1.5 nm and 3.0 nm. To satisfy the above-mentioned value of KV/kT, for example, when t1=3.0 nm, t2 had to be selected as t2/t1>0.35; when t1=2.0 nm, t2 had to be selected as t2/t1>0.45; and when t1=1.5 nm, t2 had to be selected as t2/t1>0.5.

Figure 7A:
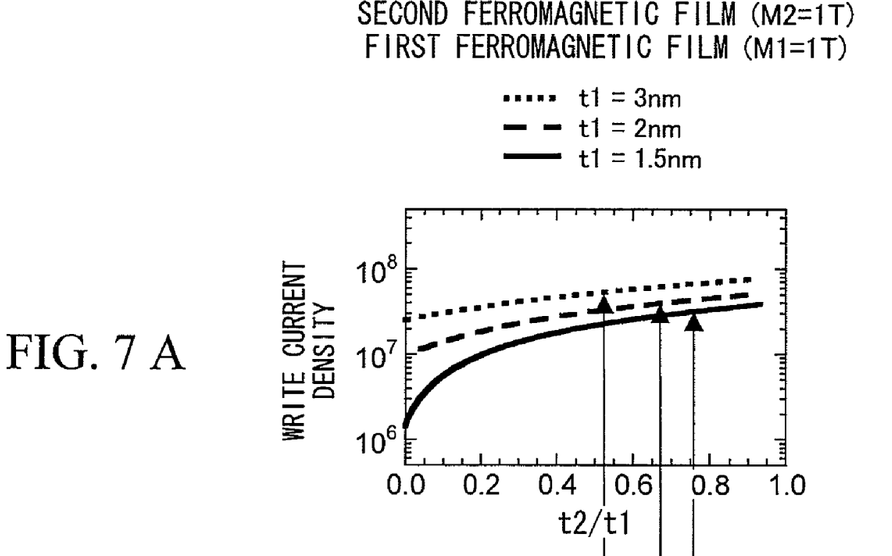
FIG. 7A is a graph showing even still another characteristic example of the write current in the tunnel magnetic resistance device of the present invention.
Figure 7B:
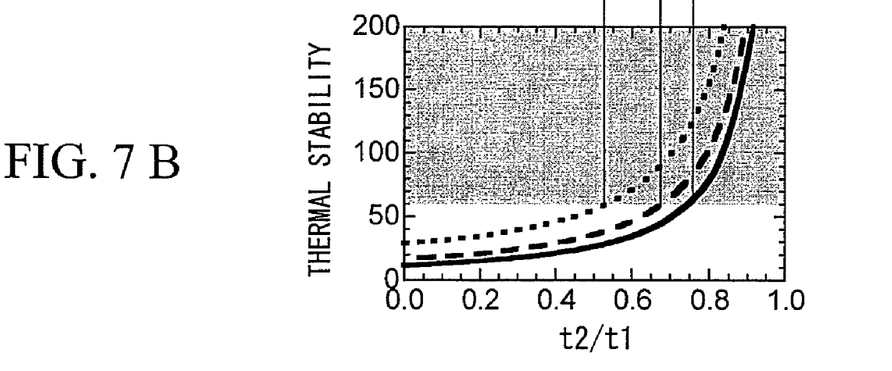
FIG. 7B is a graph showing even still another characteristic example of the thermal stability in the tunnel magnetic resistance device of the present invention.

Next, FIGS. 7A and 7B show the results in the case where M1=M2=1T. In FIG. 7A, the threshold current density Jc for spin torque magnetization reversal is plotted, for each film thickness t1, against the ratio of film thickness t2 of the second ferromagnetic film to the film thickness t1 of the first ferromagnetic film. In FIG. 7B, the parameter KV/kT showing the magnitude of thermal stability is plotted in the same way.

These results show that the same trend as the one shown in FIGS. 4A to 6A and 4B to 6B was observed. Specifically, FIG. 7A shows that, as t2 became larger, Jc increased, and that, as t1 became smaller, Jc decreased. Here, the absolute value of Jc was reduced from the corresponding values in the cases shown in FIGS. 4A to 6A and 4B to 6B. On the other hand, FIG. 7B shows that the thermal stability increased as both t1 and t2 became larger. Now, suppose that a thermal stability needed for a magnetic memory is such that KV/kT is 60 or larger, and that the film thickness t1 is within a range between 1.5 nm and 3.0 nm. To satisfy the above-mentioned value of KV/kT, for example, when t1=3.0 nm, t2 had to be selected as t2/t1>0.5; when t1=2.0 nm, t2 had to be selected as t2/t1>0.65; and when t1=1.5 nm, t2 had to be selected as t2/t1>0.75.

In the above example, M1 and M2 represent the magnitudes of magnetization of the first ferromagnetic film and the second ferromagnetic film, respectively. In a case where, for example, the first ferromagnetic film is made up of two layers such as CoFe/NiFe, CoFeB/NiFe, and CoFeB/CoFe, each of the film thicknesses of CoFe, NiFe and CoFeB is set in accordance with the magnitude of magnetization of these films in total. In addition, a single layer film of CoFe, NiFe or CoFeB may be used as the first ferromagnetic film, and the second ferromagnetic film.

EXAMPLE 2

Figure 2:
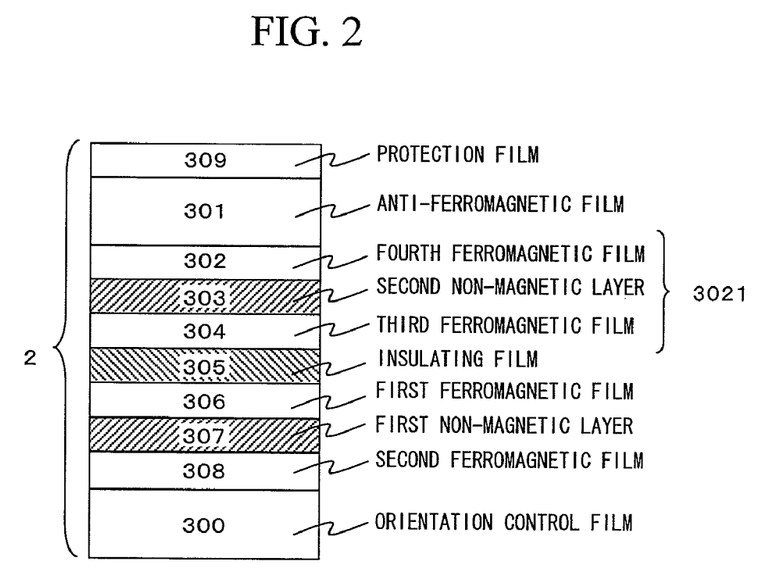
FIG. 2 is a view showing a second configuration example of a tunnel magnetic resistance device of the present invention.

FIG. 2 is a schematic cross-sectional view of another example of a tunnel magnetic resistance device according to another aspect of the present invention. This tunnel magnetic resistance device 2 was made up of an orientation control film 300, a second ferromagnetic film 308, a first non-magnetic layer 307, a first ferromagnetic film 306, an insulating film 305, a ferromagnetic pinned layer 3021, an anti-ferromagnetic film 301, and a protection film 309. In a particular case where the first ferromagnetic film 306 and a third ferromagnetic film 304 were made of CoFeB, the crystal structure of each of these two films was a body center cubic lattice. The insulating film 305 was made of magnesium oxide crystal with a rock-salt structure, which was highly oriented in the (100) direction. The three layers—specifically, the first ferromagnetic film 306, the first non-magnetic layer 307 and the second ferromagnetic film 308—constitute the free layer of the tunnel magnetic resistance device 2. The ferromagnetic pinned layer 3021 may, in some cases, include a fourth ferromagnetic film 302, a second non-magnetic layer 303 and the third ferromagnetic film 304. In the descriptions that follow, the ferromagnetic pinned layer 3021 was made up of the fourth ferromagnetic film 302, the second non-magnetic layer 303 and the third ferromagnetic film 304.

In the tunnel magnetic resistance device 2 with this configuration, the second ferromagnetic film 308 was formed as being adjacent to the orientation control film 300, while the first non-magnetic layer 307 and the first ferromagnetic film 306 were further formed on the second ferromagnetic film 308, which results in an excellent flatness. Accordingly, in comparison to the structure in Example 1, the first ferromagnetic film 307 had an improved soft magnetic property, while the free layer composed of the three layers—specifically, the first ferromagnetic film 306, the first non-magnetic layer 307 and the second ferromagnetic film 308—had an improved magnetic property. For example, the magnetization curve of CoFeB after crystallization had an improved squareness ratio. Accordingly, a smooth switching by spin torque magnetization reversal was accomplished. The insulating film 305 was also formed in a flat film. However, an anti-ferromagnetic film 301, which was formed in an upper position in the stacking direction of the tunnel magnetic resistance device 2, had an inferior orientation to the orientation of the corresponding film in Example 1. As a result, the anti-ferromagnetic coupling between the anti-ferromagnetic film 301 and the fourth ferromagnetic film 302 became weaker and made the tolerance to heat treatment deteriorated in comparison to Example 1. Specifically, the tunnel magneto resistance ratio showed a decreasing trend with a heat treatment at 400° C. It should be noted that the method of fabricating the tunnel magnetic resistance device 2 was the same as the method in Example 1, while the materials for the respective films are the same as those used in Example 1. In addition, the magneto resistance ratio obtained by this tunnel magnetic resistance device 2 were approximately the same as the corresponding ratio in Example 1—specifically, 200%.

The selection of the film thicknesses for the first ferromagnetic film 306 and for the second ferromagnetic film 308 in this Example was done in the same way as those described in the cases of FIGS. 4A to 7A and 4B to 7B.

Figure 8:
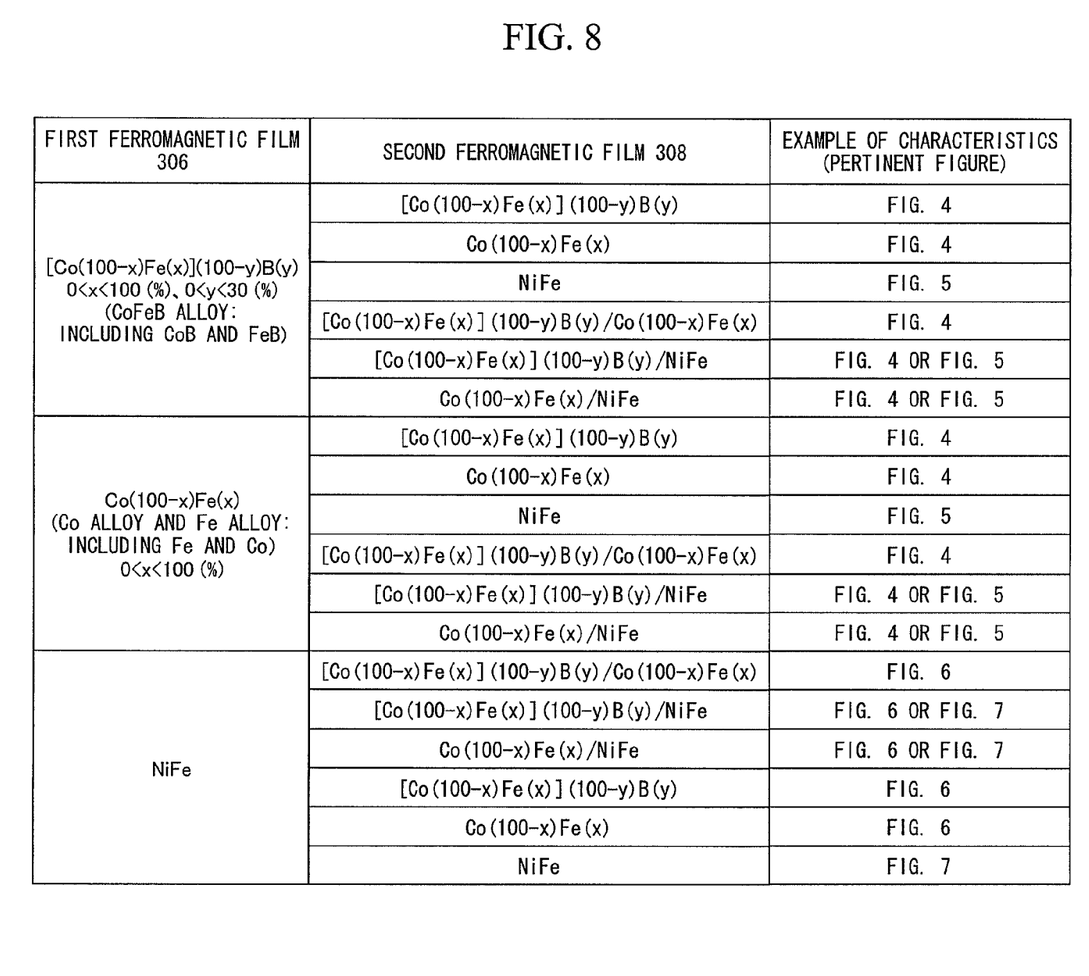
FIG. 8 is a table showing examples of materials selected for a first and a second ferromagnetic films, and also showing characteristic examples each corresponding to a combination of selected materials.
Figure 9:
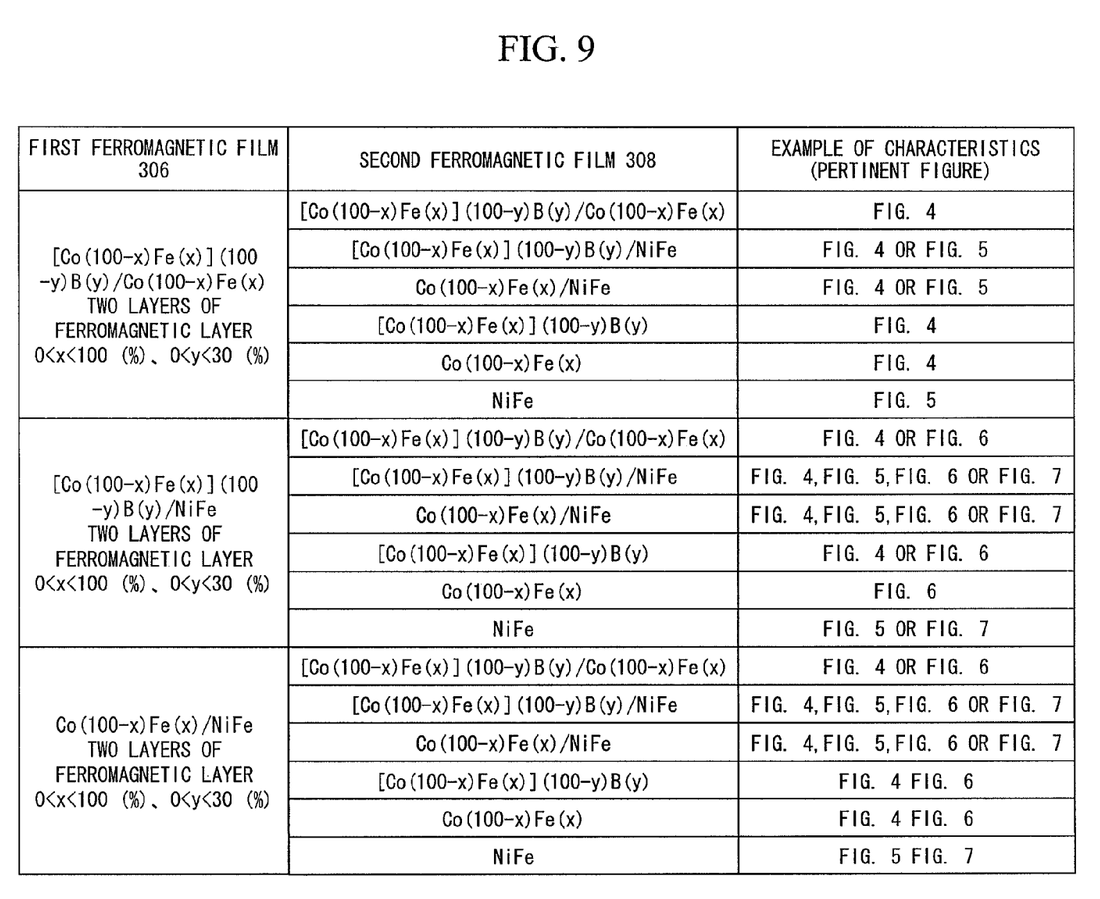
FIG. 9 is another table showing examples of materials selected for a first and a second ferromagnetic films, and also showing characteristic examples each corresponding to a combination of selected materials.

The selection of materials for the first ferromagnetic film 306 and for the second ferromagnetic film 308 as well as the corresponding results obtained for film thickness ratios shown in FIGS. 4A to 7A and 4B to 7B in Examples 1 and 2 are summed up in tables of FIG. 8 and of FIG. 9. FIG. 8 shows the cases where a single layer film is used as the first ferromagnetic film 306, while FIG. 9 shows the cases where a two-layer ferromagnetic film is used for the first ferromagnetic film 306. The materials shown in FIG. 8 and FIG. 9 can be used for the first ferromagnetic film 306 and the second ferromagnetic film 308 of the tunnel magnetic resistance devices described thus far and a tunnel magnetic resistance device that constitutes a magnetic memory cell and a magnetic random access memory described below.

EXAMPLE 3

Figure 10:
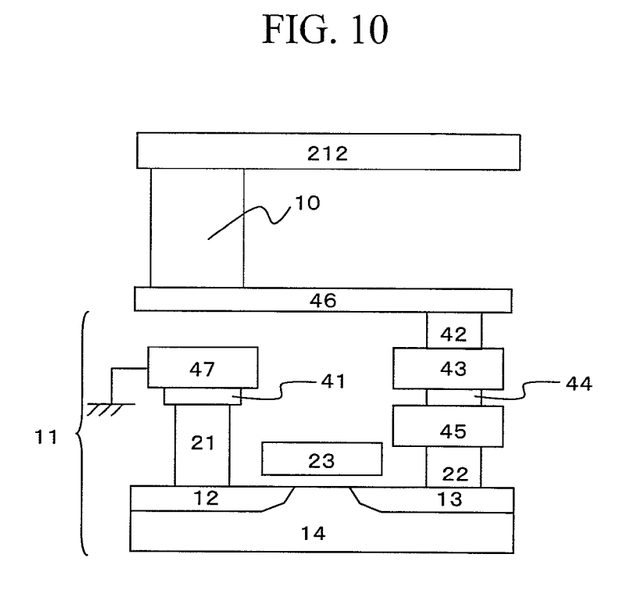
FIG. 10 is a view showing a configuration example of a magnetic memory cell of the present invention.

FIG. 10 is a schematic cross-sectional view showing a configuration example of a magnetic memory cell according to an aspect of the present invention. The magnetic memory cell includes a tunnel magnetic resistance device 10 as a memory cell, which is the same as ones shown in Examples 1 and 2.

A C-MOS 11 includes two n-type semiconductors 12 and 13 as well as a p-type semiconductor 14. An electrode 21 to be a drain electrode is electrically connected to the n-type semiconductor 12, and is connected, via an electrode 41 and an electrode 47, to the ground. An electrode 22 to be a source electrode is electrically connected to the n-type semiconductor 13. A gate electrode 23 is further provided. The ON/OFF of the current between the source electrode 22 and the drain electrode 21 is controlled by turning on/off the gate electrode 23. Layers of an electrode 45, an electrode 44, an electrode 43, an electrode 42 and an electrode 46 are formed on the source electrode 22. Via the above-mentioned layers of electrodes, and the electrode 46, an orientation control film 300 of the tunnel magnetic resistance device 10 is connected to the source electrode 22.

A bit line 212 is connected to a protection film 309 of the tunnel magnetic resistance device 10. In the magnetic memory cell of Example 3, magnetic data writing is performed by the current passing through the tunnel magnetic resistance device 10—what is termed as spin transfer torque. To this end, the magnetization direction of a ferromagnetic free layer—the layer including a first ferromagnetic film 306, a first non-magnetic layer 307 and the second ferromagnetic film 308—of the tunnel magnetic resistance device 10 is rotated by the current. The principle of the spin transfer torque is as follows. A torque acting on the magnetic moment of the ferromagnetic free layer of the tunnel magnetic resistance device is produced not by a spatially external magnetic field, but mainly by spins of the spin polarized current passing through the tunnel magnetic resistance device. Just passing current through the tunnel magnetic resistance device is the mechanism for generating this spin polarized current. Accordingly, spin transfer torque magnetization reversal is accomplished by providing means for supplying current from outside to the tunnel magnetic resistance device, and thereby applying current to the device. In Example 3, when current flows between the bit line 212 and the electrode 46, spin transfer torque acts on the ferromagnetic free layer—the layer made up of the first ferromagnetic film 306 and the second ferromagnetic film 308—in the tunnel magnetic resistance device 10. Writing by spin transfer torque only needs an electric power for writing reduced down to approximately one hundredth of the power needed for writing by current magnetic field.

Figure 11:
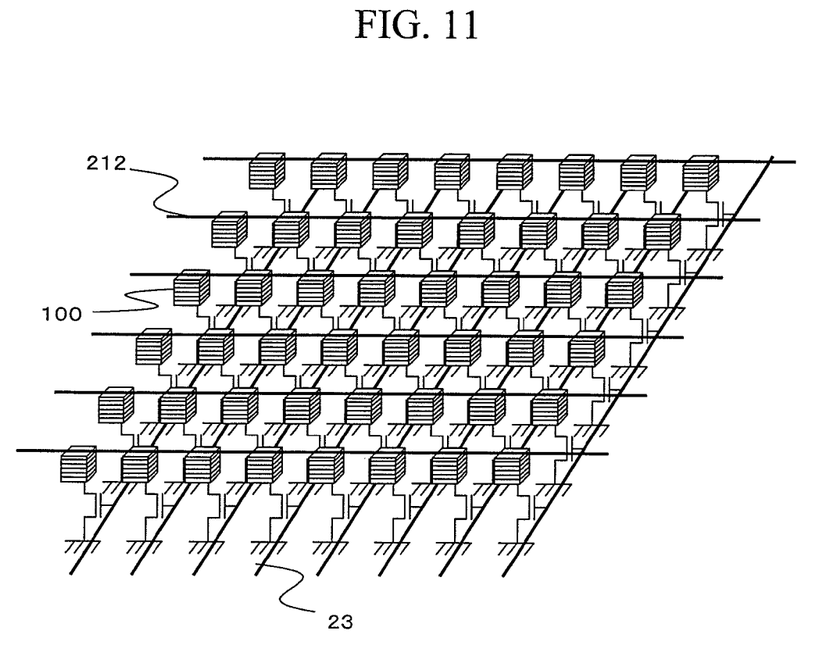
FIG. 11 is a view showing a configuration example of a magnetic random access memory of the present invention.

FIG. 11 is a view showing a configuration example of a magnetic random access memory with an array of the above-described magnetic memory cells. Gate electrodes 23 and bit lines 212 are electrically connected to memory cells 100. The magnetic memory with the array of the magnetic memory cells described in Examples 1 and 2 can operate with low-power consumption, and, as a consequence, a gigabit-class, high-density magnetic memory can be obtained.

What is claimed is:

1. A tunnel magnetic resistance device comprising:
an insulating film;
a ferromagnetic free layer; and
a ferromagnetic pinned layer formed so as to sandwich the insulating film with the ferromagnetic free layer,
wherein the insulating film is a MgO film with a (100) orientation rock-salt structure,
the ferromagnetic free layer includes a first ferromagnetic film and a second ferromagnetic film formed with a non-magnetic conductive layer interposed in between,
the first ferromagnetic film is adjacent to the insulating film,
the second ferromagnetic film and the first ferromagnetic film are anti-ferromagnetically coupled with each other, and
the ferromagnetic film pinned layer includes a film having a body center cubic structure and containing Co, Fe and B,
wherein the first ferromagnetic film and the second ferromagnetic film are films each having a body center cubic structure and containing Co, Fe and B, and
the thickness t1 of the first ferromagnetic film is larger than the thickness t2 of the second ferromagnetic film.

2. The tunnel magnetic resistance device according to claim 1,
wherein the ratio of the thickness t2 of the second ferromagnetic film to the thickness t1 of the first ferromagnetic film (t2/t1) is in a range from 0.4 to 1.0.

3. The tunnel magnetic resistance device according to claim 1,
wherein the non-magnetic conductive layer is formed of Ru, and
the film thickness of the non-magnetic conductive layer is in any one of a range from 0.4 nm to 1.4 nm, and a range from 2.0 nm to 2.8 nm.

4. The tunnel magnetic resistance device according to claim 1,
wherein the ferromagnetic pinned layer is formed on an anti-ferromagnetic film,
the insulating film is formed on the ferromagnetic pinned layer,
the ferromagnetic free layer is formed on the insulating film, and
the ferromagnetic pinned layer includes two ferromagnetic films which are anti-ferromagnetically coupled with a non-magnetic layer interposed in between.

5. The tunnel magnetic resistance device according to claim 1,
wherein the insulating film is formed on the ferromagnetic free layer,
the ferromagnetic pinned layer is formed on the insulating film, an anti-ferromagnetic film is formed on the ferromagnetic pinned layer, and the ferromagnetic pinned layer includes two ferromagnetic films which are anti-ferromagnetically coupled with each other with a non-magnetic layer interposed in between.

6. A magnetic memory cell comprising:
A) a tunnel magnetic resistance device which includes:
   a) an insulating film;
   b) a ferromagnetic free layer; and
   c) a ferromagnetic pinned layer formed so as to sandwich the insulating film with the ferromagnetic free layer,
the tunnel magnetic resistance device in which
   d) the insulating film is a MgO film with a (100) orientation rock-salt structure,
   e) the ferromagnetic free layer includes a first ferromagnetic film and a second ferromagnetic film formed with a non-magnetic conductive layer interposed in between,
   f) the first ferromagnetic film is adjacent to the insulating film,
   g) the second ferromagnetic film and the first ferromagnetic film are anti-ferromagnetically coupled with each other,
   h) the ferromagnetic film pinned layer includes a film having a body center cubic structure and containing Co, Fe, and B,
B) an electrode for applying current to the tunnel magnetic resistance device for the purpose of causing magnetization reversal in the ferromagnetic free layer by spin transfer torque; and
C) a switching element for ON/OFF control of the current passing through the tunnel magnetic resistance device, wherein the first ferromagnetic film and the second ferromagnetic film are films each of which has a body center cubic structure and each of which contains Co, Fe and B, and the thickness t1 of the first ferromagnetic film is larger than the thickness t2 of the second ferromagnetic film.

7. The magnetic memory cell according to claim 6, wherein the ratio of the thickness t2 of the second ferromagnetic film to the thickness t1 of the first ferromagnetic film (t2/t1) is in a range from 0.4 to 1.0.

8. The magnetic memory cell according to claim 6,
wherein the non-magnetic conductive layer is formed of Ru, and
the film thickness of the non-magnetic conductive layer is in any one of a range from 0.4 nm to 1.4 nm, and a range from 2.0 nm to 2.8 nm.

9. A magnetic random access memory comprising:
1) a plurality of magnetic memory cells; and
2) means for selecting a desired magnetic memory cell,
3) the magnetic random access memory wherein the magnetic memory cell includes:
   A) a tunnel magnetic resistance device which includes:
      a) an insulating film;
      b) a ferromagnetic free layer; and
      c) a ferromagnetic pinned layer formed so as to sandwich the insulating film with the ferromagnetic free layer,
   the tunnel magnetic resistance device, in which
      d) the insulating film is a MgO film with a (100) orientation rock-salt structure,
      e) the ferromagnetic free layer includes a first ferromagnetic film and a second ferromagnetic film formed with a non-magnetic conductive layer interposed in between,
      f) the first ferromagnetic film is adjacent to the insulating film,
      g) the second ferromagnetic film and the first ferromagnetic film are anti-ferromagnetically coupled with each other, and
      h) the ferromagnetic film pinned layer includes a film having a body center cubic structure and containing Co, Fe and B, and
   B) an electrode for applying current to the tunnel magnetic resistance device for the purpose of causing magnetization reversal in the ferromagnetic free layer by spin transfer torque,
wherein the first ferromagnetic film and the second ferromagnetic film are films each of which has a body center cubic structure and each of which contains Co, Fe and B, and
the thickness t1 of the first ferromagnetic film is larger than the thickness t2 of the second ferromagnetic film.

10. The magnetic random access memory according to claim 9, wherein the ratio of the thickness t2 of the second ferromagnetic film to the thickness t1 of the first ferromagnetic film (t2/t1) is in a range from 0.4 to 1.0.

11. The magnetic random access memory according to claim 9,
wherein the non-magnetic conductive layer is formed of Ru, and
the film thickness of the non-magnetic conductive layer is in any one of a range from 0.4 nm to 1.4 nm, and a range from 2.0 nm to 2.8 nm.

12. The magnetic random access memory according to claim 9, wherein magnetic data writing is performed by spin transfer torque.

* * * * *